United States Patent [19]

Lewis

[11] Patent Number: 4,881,979
[45] Date of Patent: Nov. 21, 1989

[54] JUNCTIONS FOR MONOLITHIC CASCADE SOLAR CELLS AND METHODS

[75] Inventor: Carol L. R. Lewis, Palo Alto, Calif.

[73] Assignee: Varian Associates, Inc., Palo Alto, Calif.

[21] Appl. No.: 171,629

[22] Filed: Mar. 22, 1988

Related U.S. Application Data

[63] Continuation-in-part of Ser. No. 15,538, Feb. 13, 1987, Pat. No. 4,771,321, which is a continuation of Ser. No. 837,877, Mar. 5, 1986, abandoned, which is a continuation of Ser. No. 645,181, Aug. 29, 1984, abandoned.

[51] Int. Cl.$^4$ .................. H01L 35/34; H01L 37/00
[52] U.S. Cl. ................... 136/201; 136/206; 136/236.1; 357/4
[58] Field of Search .......... 136/201, 206, 236.1; 357/4, 30, 68

[56] References Cited

U.S. PATENT DOCUMENTS

| | | | |
|---|---|---|---|
| 3,139,680 | 7/1974 | Scuro | 136/201 X |
| 3,909,617 | 9/1975 | Jones et al. | 136/202 |
| 3,973,996 | 8/1976 | Kennedy | 136/201 X |
| 4,047,436 | 9/1977 | Bernard et al. | 136/201 X |
| 4,292,461 | 9/1981 | Hovel | 136/249 |
| 4,404,421 | 9/1983 | Fraas | 136/249 |
| 4,443,650 | 4/1984 | Takagi et al. | 136/201 X |
| 4,710,588 | 12/1987 | Ellion | 136/206 |
| 4,771,321 | 9/1988 | Lewis | 357/4 |

FOREIGN PATENT DOCUMENTS 55-111270 9/1981 Japan.

OTHER PUBLICATIONS

L. M. Fraas, A. Shorting Junction For Monolithic Multicolor Solar Cells, pp. 1353–1356, 5-15-81, Conference Record of the 15th IEEE Photovoltaic Specialists.

L. M. Fraas & R. C. Knechtli, Design of High Efficiency Monolithic Multijunction Solar Cells, pp. 886–887, 6-8-78, Conference of the 13th IEEE Photovoltaic Specialists.

*Primary Examiner*—Peter A. Nelson
*Attorney, Agent, or Firm*—Stanley Z. Cole; Kenneth L. Warsh; Gerald M. Fisher

[57] ABSTRACT

In order to increase the efficiency of solar cells, a monolithic stacked device is constructed comprising a plurality of solar sub-cells adjusted for different bands of radiation. The interconnection between these sub-cells has been a significant technical problem. The invention provides an interconnection which is an extremely thin layer of gold formed between the sub-cells by organometallic chemical vapor deposition. Such a layer tends to form beads which serve as a low resistance shorting interconnect while passing a large fraction of the radiation to the lower sub-cells.

20 Claims, 6 Drawing Sheets

JUNCTIONS FOR MONOLITHIC CASCADE SOLAR CELLS AND METHODS

This a continuation-in-part of application Ser. No. 015,538, filed Feb. 13, 1987 now U.S. Pat. No. 4,771,321, which is a continuation of U.S. application Ser. No. 837,877, filed Mar. 5, 1986, now abandoned, which was a continuation of U.S. application Ser. No. 645,181 filed Aug. 29, 1984 and now abandoned. U.S. application Ser. Nos. 052,142 and 820,338 are related.

FIELD OF THE INVENTION

This invention pertains to solar cells having a gold junction between the sub-cells of different spectral sensitivity, and to a method of forming such devices.

BACKGROUND OF THE INVENTION

In order to carry out an efficient conversion of a spectrum of electromagnetic radiation into electrical current, attempts have been made to develop commercial devices called monolithic cascade converters which provide multiple, typically two, semiconductor junctions within one device, one junction having a low characteristic electromagnetic energy gap and the other a high characteristic electromagnetic energy gap. Each of these junctions will be called sub-cells. The energies of the low and high energy gaps are chosen so as to optimize coverage of the incident electromagnetic spectrum, thereby maximizing the efficiency of converting incident electromagnetic radiation into electrical energy. For example, the theoretical maximum electrical energy. For example, the theoretical maximum efficiency for a two-junction GaAs based device has been calculated to be in excess of 35% near ambient temperature for a typical solar spectrum measured at the earth's surface.

A number of complex connection methods have been proposed for connecting the sub-cells together. One such proposed method is called the metal-interconnected cascade cell, or MICC. See, for example, the paper of Ludowise et al, "High-Efficiency Organometallic Vapor Phase Epitaxy AlGaAs/GaAs Monolithic Cascade Solar Cell Using Metal Interconnects," Appl. Phys. Lett. 41(6) 550–552, 15 Sept. 1982. Metallization schemes such as the MICC involve complex and tedious processing (photolithography, etching, metallization), generally leading to low yields (about 10%) of successfully processed cascades. The extension of this MICC procedure to connect more than two sub-cells in series would involve extremely complex low yield processing and would significantly increase the metal grid shadowing of active cell areas.

Another proposed method of connection uses a germanium interconnect grown between the sub-cells. The low band gap of the Ge is said to permit the facile formation of tunnel junctions in the Ge which would possess the necessary high ohmic conductance. See for example the paper of Fraas, "A Shorting Junction for Monolithic Multicolor Solar Cells," Proc. 15th IEEE Photovoltaic Specialists Conference, Orlando, Fla., May 1981, pp. 1353–1356. The germanium tunnel junction is vulnerable to degradation via dopant diffusion during subsequent high-temperature processing steps. This is illustrated by some calculations by Fraas (Proc. 13th IEEE Photovoltaic Specialists Conference, 1978, Washington, DC, pp. 886–891). At a p-n tunnel junction, carriers tunnel through a barrier of width W. The junction resistance is extremely sensitive to changes in W; e.g., increasing W by only 20Å increases the resistance by an order of magnitude. For example, a tunnel junction of depletion width 125Å and conductivity 10 A/V-cm$^2$ (sufficient to support a cascade operating at approximately 100 suns concentration, with less than 3% total power loss due to the tunnel junction) degrades to a conductivity of 1 A/V-cm$^2$ at 145Å thickness, and 0.1 A/V-cm$^2$ at 165Å thickness. The 165Å junction will support the cascade only under 1 sun and is too resistive for use under concentration. Further, junction smearing (e.g., by dopant diffusion) will render the junction useless as an interconnect. Unfortunately, this degree of diffusion can occur extremely readily under cascade growth and processing conditions.

The use of highly doped, abrupt junctions (tunnel diodes or backward diodes) to serve as high conductance interconnects has also been described. See for example the paper of Miller et al, "GaAs/AlGaAs Tunnel Junctions for Multigap Cascade Solar Cells," J. Appl. Phys. 53(1) 744–748, Jan. 1982; Bedair et al, "AlGaAs/GaAs High Efficiency Cascade Solar Cells," Proc. 15th IEEE Photovoltaic Specialists Conference, Orlando, Fla., May 1981, pp 21–26. Such highly doped, abrupt junctions have not yet been shown to be stable under cascade growth conditions. The successful use of such junctions requires that the high-conductance III-V characteristic (signifying degenerate doping levels on either side of the junction and an exceedingly abrupt doping profile) be retained during growth of the full cascade. If the Eg of the interconnect material is lower than that of the overlying sub-cell, the interconnect total thickness must be extremely thin ($\leq$125 Angstroms n-type or <150 Angstroms p-type) in order that it absorb $\leq$3% of the radiation destined for the underlying sub-cell(s). The degradation of high conductance behavior, caused by dopant diffusing during the growth conditions required for the full cascade, has been virtually impossible to avoid.

The use of superlattices to short junctions via defect tunneling, and thus create a high conductance junction, has been described in theory, but to my knowledge has never actually been constructed. See, for example, U.S. Pat. No. 4,278,474 to Blakeslee, et al. To date no working prototype device exists using a superlattice to actually short out a junction.

Another recent type of cell employs a shorted junction which relies on defect states, but does not use a true superlattice, to short the unwanted junction between a lower Si cell and an upper GaAs cell. The shorting junction functions because of defect tunneling. The defects are introduced via the lattice mismatch between the Si of the lower cell and Ge in the shorting layer. No metal is used in the junction. (See B. Y. Tsaur, et al, Paper #2, Session 4B, 17th IEEE Photovoltaic Specialists Conference, Orlando, Fla., May 1–4, 1984).

The performance of a solar cell is usually described in terms of fill factor, $V_{oc}$ and $I_{sc}$ defined as follows. $V_{oc}$ is the voltage at zero current or open circuit voltage. $I_{sc}$ is the current at zero voltage or at short circuit. The fill factor is a measure of the "squareness" of the power characteristics, and of what fraction of $V_{oc}$ and $I_{sc}$ are contributing to cell power output. If $I_m$ and $V_m$ are the current and voltage at maximum power output, then fill factor is defined as the product of $I_{sc}$ times $V_{oc}$ divided by the product of $I_m$ times $V_m$.

OBJECTS OF THE INVENTION

An object of the invention is to provide a practical, commercial method of forming a multilayered solar cell without the complex and tedious processing steps of so-called MICC method, thereby reducing time and expense of manufacture and improving yields.

A further object is to provide such a method which would be stable under cascade growth conditions.

A further object is to provide such a method which would be much faster and cheaper to use than any other method thereby reducing the cost of the solar cells.

BRIEF SUMMARY OF THE INVENTION

According to the invention a first sub-cell is formed on a substrate. A thin layer of high ohmic conductance material is then formed on the first sub-cell. The term "ohmic" will be used in this specification to encompass true ohmic and quasi-ohmic. (See S. M. Sze, "Physics of Semiconductor Devices", Vol. I, p. 416, Wiley-Interscience, NY, 1969, and A. G. Milnes and D. L. Feucht, "Heterojunctions and Metal-Semiconductor Junctions", p. 288, Academic Press, NY, 1972.) The second sub-cell is thereafter formed on top of this junction layer. Each sub-cell is lattice-matched to within 0.5% to the substrate. Alternately, if appropriate grading layers are used between the substrate and lower cell, or between the sub-cells, the individual sub-cells do not have to be lattice-matched to either the substrate or to each other. If additional sub-cells are desired, a similar junction layer is used as an interconnect for each pair of sub-cells. All process steps are compatible with formation and retention of ohmic contact at the interface between each sub-cell and the layer of high ohmic conductance material.

The thin layer of high ohmic conductance material such as indium, gallium, aluminum, etc. with various alloys chosen for bonding characteristics is deposited during device growth. In the preferred embodiment "beading" of the layer of high ohmic conductance material is thought to improve light transmission to the lower sub-cells and preserve lattice-matching to the upper sub-cell. The term "beading" is used herein to mean formation of disconnected regions of high ohmic conductance material whether formed by unconnected nucleation centers in an extremely thin layer or under some influence of surface tension as a liquid in a thicker layer. The monolithic cell produced with this interconnect layer exhibits voltage addition and good fill factors. No additional processing, subsequent to growth, as compared to a single junction device is necessary. In addition, the interconnect has been demonstrated to have high interconnect stability (high ohmic conductance retention) under the conditions required to grow a full cascade cell.

In a preferred embodiment of the method, the device is formed using organometallic vapor phase epitaxy (MOCVD). The nature of the MOCVD process requires that oxygen be excluded from the system. Not only does it react with the transport materials (trimethylgallium, trimethylindium, etc.), but oxygen acts as a carrier trap and recombination center in many semiconductors, degrading device performance. Hence, oxides of indium, for example, would not be deposited in a properly functioning MOCVD system. If the In were put down by an alternate method involving air exposure, the In would oxidize and the interconnect would be degraded.

The structure of this invention appears to create a high conductance junction by a different mechanism as compared to the tunnel junction. I believe this invention shorts the junction by ohmic contacting the p and n sides directly with high ohmic conductance material. The high ohmic conductance material appears to alloy a relatively short distance into the p and n semiconductors; hence dopant diffusion which would ruin an all semiconductor tunnel junction does not appear to degrade this ohmic short.

The invention is a great improvement in the technology of solar cell manufacture. It is simpler than any other method yet disclosed and has been shown by laboratory testing to be rugged and reliable. An increase in the rate of production by about a factor of five to seven has been estimated for the invention over the MICC technique.

These and further constructional and operational characteristics of the invention wil be more evident from the detailed description given hereinafter with reference to the figures of the accompanying drawings which illustrate a preferred embodiment and alternatives by way of non-limiting examples.

DETAILED DESCRIPTION OF THE PREFERRED EMBODIMENTS

A. Structure of the Device

Figure 1:
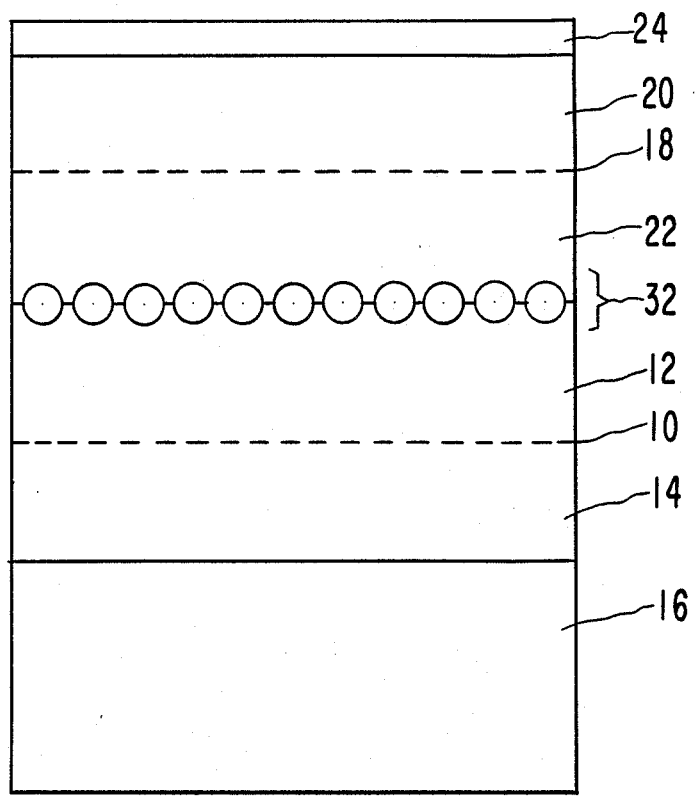
FIG. 1 is a schematic section through a monolithic solar cell showing the interconnect according to the invention.

According to the invention, the shorting junction places a very thin layer of high ohmic conductance material, such as indium, at the desired high ohmic conductance interface. In the method of the invention, doping or alloying of the high ohmic conductance material may be done during its deposition and it appears to improve the ohmic contact. Alternately, if the dopants in the adjacent III-V layers possess sufficiently high diffusion coefficients, they will diffuse into the high ohmic conductance material during growth. Additional intentional doping of the layer of high ohmic conductance material is optional. An example of a n or p interconnect linking two p or n sub-cells is illustrated in FIG. 1. Again a first sub-cell having junction 10 with upper p or n layer 12 and lower n or p layer 14 is formed on substrate 16. A second sub-cell having junction 18, upper p or n layer 20, lower n or p layer 22 and window and cap layer 24 is connected to the first sub-cell by a shorting interconnecting layer of high ohmic conductance material 32, for example, indium. In the instance where the semiconductor is GaAs, the highly doped GaAs immediately adjacent to the In permits p- and n-dopant diffusion into the In. Multiple interconnects can be used to link a larger number of sub-cells than the two illustrated here. All sub-cells are lattice-matched to the substrate to within 0.5%. Alternately, if appropriate grading layers are used between the substrate and lower cell, or between the sub-cells, the individual sub-cells do not have to be lattice-matched to either the substrate or to each other.

Junction layers of metal of average thickness 10Å to 50Å have been particularly successful. However, there is no reason to believe that layers of somewhat lesser or greater thickness would not also work.

Figure 2:
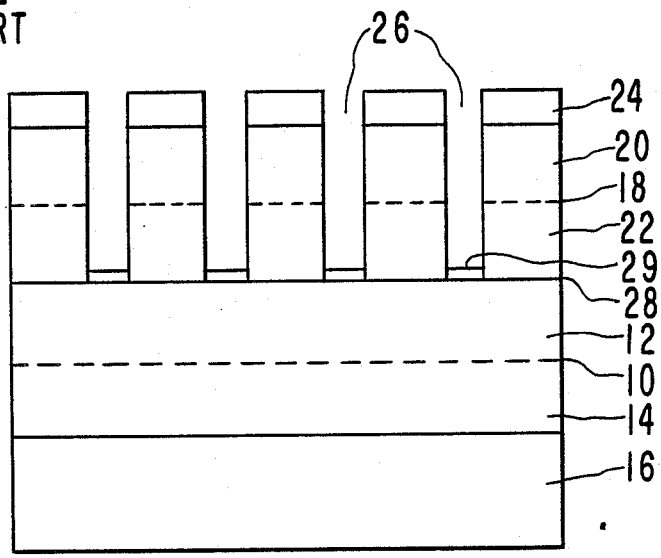
FIG. 2 is a schematic section through a monolithic solar cell showing the metal-interconnect-cascade-cell of the prior art.

In contrast, prior art is shown in FIG. 2 as a schematic section through a monolithic solar cell showing the metal-interconnect cascade cell. The first sub-cell with junction 10 having upper p or n layer 12 and lower n or p layer 14 is shown on substrate 16. The second sub-cell has junction 18 with upper p or n layer 20 and lower n or p layer 22. On top of the cell are window and cap layers 24. Narrow metallization channels 26 are formed through the window and cap layers 24, the upper 20 and lower 22 layers of the second sub-cell to the interface 28.

Metal is deposited at the bottom 29 of the channel 26 at the interface 28.

Figure 3:
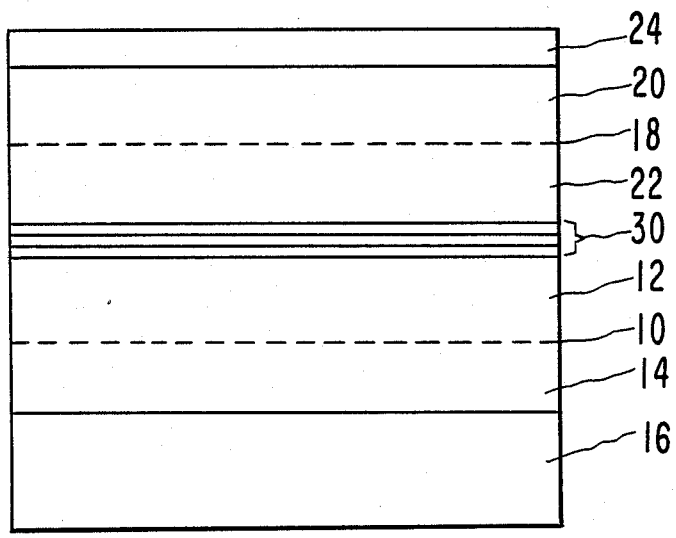
FIG. 3 is a schematic section through a monolithic solar cell showing the superlattice interconnection of the prior art.

In FIG. 3, a schematic section of a solar cell with the proposed superlattice interconnection of the prior art is shown. Again, the first sub-cell with junction 10 having upper p or n layer 12 and lower n or p layer 24 is shown on substrate 16. The second sub-cell has junction 18 with upper p or n layer 20, lower n or p layer 22, and window and cap layers 24. The superlattice 30 is shown as a series of layers between the first and second sub-cells.

B. Advantages of the Structure of the Invention

From comparison of these figures, it can be seen that the structure of the metal interconnect of the invention is much simpler than the other structures and hence, requires fewer steps in fabrication at a great saving of time and expense.

The invention is very versatile and can be adapted to a III-V semiconductor materials system or other systems. Individual solar cells in a wide variety of other materials systems are known. Some of these cells are constructed from other classes of semiconductors (II-VI systems, I-III-VI2 systems, etc., where the Roman numeral refers to the column of the Periodic Table in which the relevant element is located) or combinations of such classes (e.g., containing more than one such class within the cell). Other cells contain other types of junctions: e.g., semiconductor-metal; organic semiconductors in combination with other organic semiconductors, inorganic semiconductors, or metals. I believe the inventive structure is also applicable to polycrystalline and amorphous cell materials (as well as single-crystal). This structure seems especially suitable for cells of amorphous silicon.

The device of the invention, as hereinbefore described, deals with the application of the high ohmic conductance interconnection in a cascade solar cell or photovoltaic converter. The high ohmic conductance interconnection could also be applied to other devices in which its presence were necessary to short out any unwanted junctions in the structure. Such an application might either be necessary for proper performance of the device, or might be useful in selective testing of the components of a complex multilayer structure under the conditions required for growth of the whole. Examples of other optoelectronic sub-devices besides solar cells which might be used in a monolithic device are lasers, LED's, and optical modulators.

If the layer of high ohmic conductance material is sufficiently thin, it will not reflect or absorb a significant fraction of the light destined for the underlying cell(s). This permits series operation of the sub-cells and yields a functioning monolithic cascade.

The low resistance of the interconnect enhances such important cascade parameters as Voc, Isc and fill factor.

C. Testing of the Device

To date, I have grown more than 150 assorted test structures, related to the interconnecting junctions of interest. These include: isolated interconnecting junctions, interconnecting junctions grown under cascade growth conditions, and combinations of GaAs cells and AlGaAs cells with the interconnecting junctions. The interconnection reproducibility demonstrates viability of the concept through a wide range of varying experimental conditions designed to improve and optimize the structures.

The prototype interconnecting structures are routinely tested under the same conditions and using the same equipment used in these laboratories for diodes and single-junction cells. No degradation due to processing, handling, or the passage of time has been observed. The techniques for processing a final device are the same as those used in the processing of single-junction cells, which have been demonstrated in these laboratories to be reliable and reproducible.

Test Example 1 (Performance of Cells Beneath High Conductance Layer)

A GaAs cell was grown on a GaAs substrate, followed by the intermediate high-conductance layer of In or Ga, then a high-bandgap (1.6 to 1.8 eV) layer of GaAs, an upper window and finally, a top contact. The regions grown after the high-conductance layer are grown under conditions which approximate the time, temperature, materials and conditions which would be required to grow an upper cell (such as AlGaAs). However, no junction is present in the upper region, so that the lower region is the only photoactive region. The high conductance layer of In or other metal is sandwiched between 800Å of underlying AlGaAs and 800Å of overlying GaAs. I observe 10% decrease in lower region cell internal quantum efficiencies in these tests, as compared to totally unobscured cells. This 10% loss is believed entirely attributable to the absorptivity of the top 800Å of GaAs, and hence, the In metal layer is not believed to be contributing appreciably to any losses in efficiency by process. This test was repeated several times with the same results.

Test Example 2 (Quality of Overlying Material)

High-efficiency GaAs cells have been routinely grown atop the high-conductance layers made according to this invention on top of a single crystal GaAs cell. These cells all have high internal quantum efficiencies, high photoluminescence efficiencies and specularly reflective surfaces; these parameters all indicate good crystal quality. The cell parameters, in fact, are virtually indistinguishable from those of comparable GaAs cells grown directly upon single crystal GaAs substrates with the same processes. Because the lattice constants and crystal structures of the In metal and the GaAs semiconductor differ drastically, it is believed that it would be extremely difficult, if not impossible, to grow high-quality single-crystal GaAs atop a continuous $I_n$ film.

Test Example 3 (Cells of Different Bandgap)

The high-conductance junction has been used to link two sub-cells of different bandgap. The lower sub-cell was GaInAs (bandgap 1.2 eV) and the upper sub-cell was GaAs (bandgap 1.4 eV). Voltage addition was observed and the interconnecting junction showed no signs of degradation subsequent to growth and processing.

Test Example 4 (Additional Materials)

The junction according to the invention has also been used to form test structures having sub-cells of AlGaAs in combination with other semiconductors such as GaAs and GaInAs.

Test Example 5 (Reversed Polarity)

Tests were conducted in which the order of p and n layers was reversed in cells using the interconnect of the invention, thereby reversing the electrical polarity of the entire structure with equal success. This is important for embodiments where the deposition sequence of the surrounding layers is critical to device success.

Test Example 6 (Combinations of Metals)

Numerous tests were conducted in which a mixture of metals such as gallium and indium were combined in sequential thin layers to produce an interconnect more highly conducting than either metal above.

Test Example 7 (Distinct Spots)

Scanning electron microscope studies have been made of indium layers of the thickness used in the interconnect on top of semiconductor materials as used in these solar cells. These studies indicate that the indium is forming distinct spots.

D. Theory of Operation of the Device

The invention is thought to work by low resistance ohmic contacting of both upper and lower sub-cells, hence eliminating or by-passing the depletion region and diode effect which normally takes place when p-type material is grown on n-type material.

The interconnecting high ohmic conductance layer is extremely thin. High-quality semiconductor material is routinely grown atop it. If the high ohmic conductance material were being deposited as a continuous film, it is expected the following would be observed:

1. Cells underneath the high ohmic conductance layer would receive much less illumination and would test poorly, since continuous thin (approximately 50 Å) high ohmic conductance layers normally possess high reflectances and optical absorptivities. In my tests, however, I observe good performance from these cells.

2. The semiconductor material grown atop the high ohmic conductance material would be expected to be damaged substantially due to a large number of lattice defects being introduced at the semiconductor/high-ohmic-conductance layer interfaces, which would be expected from nucleating single-crystal semiconductor atop a high ohmic conductance layer of different crystal structure. In reality, however, no such extensive damage is observed.

It therefore is postulated that the high ohmic conductance layer is being deposited as small "beads", which might be nucleation centers which have not grown together in the thinnest layers or drops held together by the surface tension of the metal in the thicker layers. Gallium and indium are both liquid at the growth temperatures used, but this may not be important. Upon completion of metal deposition, semiconductor deposition is reinstituted. It is believed that growth proceeds initially in the areas not covered by the high ohmic conductance material, and eventually the semiconductor laterally overgrows the high ohmic conductance material. Single crystallinity and good semiconductor quality are retained.

It is not deemed necessary to have a continuous layer of high ohmic conductance material in order to cause the interconnecting junction to short. The situation might be similar to that used in the MICC device; if the high ohmic conductance areas are sufficiently closely spaced as to be accessible to carriers, only a relatively small percentage of the junction need be physically shorted. The high ohmic conductance layer is kept sufficiently thin as to:

1. absorb negligible light destined for lower sub-cells;
2. reflect negligible light destined for the lower sub-cells; and
3. not interfere with the growth of overlying high-quality material.

The lower the fraction of the junction actually covered by high ohmic conductance material, the thicker the high ohmic conductance layer can be, as long as the above three criteria are met.

E. Other Embodiments of the Device

The high ohmic conductance layer can be laid down as successive sublayers of different composition to provide better ohmic contacting to the semiconductor layers above and below. Different materials (or combinations of materials) can be used to short out the interconnecting junction in a manner analogous to that of the indium, i.e., by ohmic contacting of the adjacent layers, with or without supplementary defect tunneling. An example is the use of a different metal or alloy which can ohmic contact the adjacent semiconductor layer; or the successive deposition of several metal or alloy layers, in which the lowermost ohmic contacts the lower semiconductor and the uppermost ohmic contacts the upper semiconductor (the metal layers ohmic contact each other). In some cases, the shorting material must be doped in order to effectively ohmic contact the adjacent semiconductor layers. Undoped In can effectively ohmic contact n-type GaAs (although n-doping of the $I_n$ enhances the contact), but p-doping of the $I_n$ is necessary for it to effectively contact p-type GaAs. Undoped Ga can ohmic contact p-GaAs (although p-doping of the Ga enhances the contact), but n-doping of the Ga is necessary for it to effectively ohmic contact n-GaAs. (See B. L. Sharma, "Ohmic Contacts to III-V Compound Semiconductors", pp. 1–38, in Semiconductors and Semimetals, ed. R. K. Willardson and A. C. Beer, Vol. 15, Academic Press, NY, 1981.) Thus, the invention can be practiced using either Ga or In as the shorting metal, and n-doping of the shorting metal. The interconnect will work without this deliberate doping, if there is sufficiently high doping in the adjacent semiconductor layers to permit a good ohmic contact to be made. However, deliberate addition of dopant to the metal provides a relatively large reservoir of dopant which can diffuse into the semiconductor creating a desired highly-doped region adjacent to the metal. This may be more facile under some conditions than doping the semiconductor alone. The same semiconductor need not be used on both the p- and n- sides of the interconnection. For example, interconnecting junctions are possible containing p-AlGaAs and n-GaAs, or p—$Al_xGa_{1-x}As$ and n—$Al_yGa_{1-y}As$ ($x \neq y$), adjacent to the shorting material.

The invention can contain GaAs sub-cells grown upon a GaAs substrate. Alternatively, III-V ternary or quaternary semiconductors could be substituted for the GaAs sub-cells, for example, AlGaAs, GaInAs, GaAsP, AlGaAsP, etc. This would create an analogous cascade device, but one with somewhat different optical and electronic properties than the all-GaAs one. In any cascade, the sub-cells would be required to be of different bandgaps (the higher-bandgap sub-cells uppermost, assuming illumination from the top), in order that all the sub-cells contribute to utilization of the incident light.

Note that the shorting junction should not absorb a significant amount of light destined for lower sub-cells. If the bandgap of the semiconductor(s) dopant used in the shorting junction equals or exceeds the bandgap of the immediately overlying cell, there is no degradation. If the bandgap of the dopant semiconductor(s) in the shorting junction is lower, however, it is very advantageous to keep the layers of the shorting junction very thin, so that it absorbs only a small amount of light.

The use of alternate substrates, such as InAs, InP, GaP, etc., is also possible. The selection of substrate for solar cells usually is influenced by the choice of sub-cell materials, their lattice constants, bandgaps, thermal stabilities, etc.

In an alternative embodiment n on p sub-cells may be substituted for p on n sub-cells, or vice-versa as long as the type of cell alternates appropriately.

The primary type of the interconnect would, of course, be adjusted also as described above.

I believe that metal-silicides would also be useful high ohmic conductance material in a cell using amorphous silicon.

F. Example of the Method

In the preferred embodiment of the method, a monolithic cascade solar cell was made by organometallic vapor phase epitaxy, also known as metalorganic chemical vapor deposition (MOCVD). The system consisted of a stainless steel gas-handling system attached to a quartz reactor tube. The liquid and solid sources (transport agents) were contained in stainless steel or glass bubblers or sublimers, attached to the gas-handling system, with appropriate valves between the sources and the main system lines. Gaseous sources were prediluted with hydrogen and stored in compressed gas cylinders, with appropriate valves between the sources and the main system lines. Electronic mass flow controllers were used to regulate the gas flows.

A typical substrate wafer of GaAs was solvent cleaned with solvents such as acetone, trichloroethylene, or isopropanol, then etched with a mixture 8:1:1 by volume comprising concentrated sulfuric acid, 30% hydrogen peroxide in water, and water, then rinsed in deionized water and then dried under a filtered nitrogen stream. The wafer was loaded onto a silicon-carbide-coated graphite block, which was placed into the quartz reactor tube. The tube was closed and purged with pure hydrogen carrier gas for 30 minutes. The substrate was then heated via the rf coils placed around the middle of the reactor and enveloping the graphite block. The growth temperature was monitored via a thermocouple inserted into a well in the graphite block and through a feedthrough in the quartz reactor tube. The carrier gas flow was maintained during the purge and growth run at 8 liters/min. When the substrate temperature reached approximately 200° C., the arsine flow over the wafer at approximately 125 $cm^3$/min was started, to prevent arsenic from evaporating from the hot wafer surface and degrading its morphology.

The wafer was heated to 880° C. over a 10-minute period and held at 880° C. for 2 minutes to remove surface oxides. The wafer was then cooled to the starting growth temperature, over a 5-minute period. GaAs was typically grown at 730° C. For other materials, optimum growth temperatures varied between 600° C. and 800° C. By opening appropriate inlet and outlet valves on the liquid or solid organometallic source cylinders and closing the corresponding bypass valves, appropriate carrier gas streams saturated with organometallic source vapors were set up and injected into the reactor. Gaseous sources were prediluted in hydrogen and the hydrogen mixture injected into the reactor. The vapors were copyrolyzed in the reactor hot zone, leading to deposition. For example: To deposit zinc-doped GaAs, a mixture of trimethylgallium, diethylzinc and arsine in hydrogen was mixed and flowed over the wafer. Typical mole fractions for the growth of such GaAs with Zn doping level approximately $6 \times 10^{-4}$/$cm^3$ at 5 micrometers/hr were: trimethylgallium, $1.4 \times 10^{-4}$; arsine, $1.4 \times 10^{-3}$; diethylzinc, $1 \times 10^{-6}$. In one particular reactor, these mole fractions had corresponding source temperatures and carrier gas flow rates of trimethylgallium, 24.4 $cm^3$/min, source at $-11°$ C.; diethylzinc, 2 $cm^3$/min, source at 0° C.; arsine, 122 $cm^3$/min, prediluted mixture of 10% arsine in hydrogen.

To deposit layers of different materials, the appropriate system valves were opened and closed, and the gas flows adjusted in accordance with the desired material composition. The overall growth rate was approximately 5 micrometers/hr; several hours would be required for a typical growth. After growth was complete, the wafer was cooled down, under a flow of hydrogen and arsine. The arsine flow was stopped when the temperature of the wafer reached 200° C.; the carrier gas flow was maintained down to room temperature. The reactor was then opened and the wafer removed.

Other transport agents used in this system included trimethylindium (for In), trimethylaluminum (for Al) and hydrogen selenide (for Se). An average layer thickness of 10 Angstroms to 50 Angstroms produced an effective interconnect using indium. The indium of the interconnect was deposited by admitting the transport agent, trimethylindium, to the reaction chamber while interrupting the arsine flow. The indium deposition thus preferably should occur over a short period of time ($\leq 30$ sec) to minimize hermal degradation of the underlying surface.

The purity of the high ohmic conductance material should be comparable to that of the semiconductor materials used in the cell, in order that the interconnecting junction be compatible with them. Typical purities of transport agents used in this growth technique is 99.999% (analysis by atomic absorption spectrometry, with special concern for low transition metal levels).

G. Advantages of the Method

It can be seen from the foregoing example that the formation of a monolithic solar cell by the method of forming a high ohmic conductance layer between the sub-cells according to the invention is a faster and simpler, and thus, more reliable, and higher yield method than the MICC method. In addition, the devices so formed are more reliable, rugged and inexpensive device than in the prior art.

Relative to MICC and derivative configurations which short the undesired junction by metallization during processing, the processing time is reduced significantly. Because the processing is simpler the yields are significantly higher than for MICC structures. The invention renders a cascade far more amenable to scale-up in production and enhances reproducibility of behavior.

Relative to tunnel junctions, the ohmic contact is more stable under the conditions required for growth of a cascade cell and is relatively insensitive to degradation caused by dopant diffusion or interface smearing during cascade growth. By contrast, tunnel diodes degrade into rectifying diodes under comparable conditions, leading to highly resistive interconnects and poorly performing cascades. The concept of a superlattice to short a junction via defect tunneling has not yet been physically demonstrated; the junctions are still rectifying. Moreover, the high ohmic conductance layer is inherently simpler and cheaper than the superlattice.

H. Improvements to the Method

In a particularly advantageous improvement to the invention, gold is used for the interconnection material. It has been found that for indium or gallium in contact with certain materials, the resistivity of the interconnect is not as low as is desired. Gold interconnections, on the other hand, have been found to have low resistivity in all cases.

Indium and gallium are excellent for one-sun applications and work well where the bandgap of the upper subcell (and hence of the high-conductance junction) does not exceed 1.7 eV. Junctions of these materials have been demonstrated to retain their high conductance during the conditions required for growth and processing of the full cascade and, their deposition conditions are fully compatible with those required to produce high efficiency subcells. The resistance of the junction is excessive for concentrator cells or for structures in which the bandgap of the high-conductance junction exceeds approximately 1.7 eV. This is especially true for AlGaAs (particularly n-type), to which In and Ga do not appear to form contacts of very low resistance.

In the improved method, a thin layer of gold is deposited in situ, during the same growth run used to grow the cascade, at the desired interface. In combination with the immediately surrounding semiconductor layers, this yields a high conductance junction. The structure works by ohmic-contacting and hence shorting the p-n interface. There is also a component of defect tunneling associated with the metal-semiconductor interface, due to the large changes in lattice parameters. If the gold layer is sufficiently thin and/or discontinuous, it will not absorb or reflect a significant fraction of the light destined for the underlying subcells.

The preferable gold source is a volatile organometallic which undergoes thermal decomposition in the hot zone of the MOCVD reactor to yield elemental gold. Examples of three chemically related gold transport agents (available from American Cyanamid) are:

1. Dimethyl gold acetylacetonate [DMG (acac)]
2. Dimethyl gold trifluoro-acetylacetonate [DMG (tfac)]
3. Dimethyl gold hexafluoro-acetylacetonate [DMG (hfac)].

The nature of the material immediately surrounding the shorting metal will affect the resistance of a high conductance junction. For the In- and Ga-containing structures, the highest conductances are obtained when the bandgap of this immediately surrounding matrix material is relatively low. When the bandgap is required to be relatively high, the junction resistance goes up. However, the high conductance junction containing Au as a shorting metal is expected to have a much lower resistance even if materials of relatively high bandgap, such as AlGaAs, are adjacent to the shorting metal. These adjacent layers are the p+ and n+ AlGaAs. The relatively heavy doping in these layers facilitates formation of ohmic contacts. (This is true of all semiconductors but in particular for those of high bandgap, to which it may be more difficult to form low resistance ohmic contacts.)

In the case of optical devices such as solar cells, the high conductance junction (including the shorting metal and the layers adjacent to it) preferably should contain no material of lower bandgap than that of the overlying device. If it does contain such material, the layer(s) should be sufficiently thin, or discontinuous, as to reflect or absorb only a small amount of light which would be destined for the underlying device(s).

Figure 4:
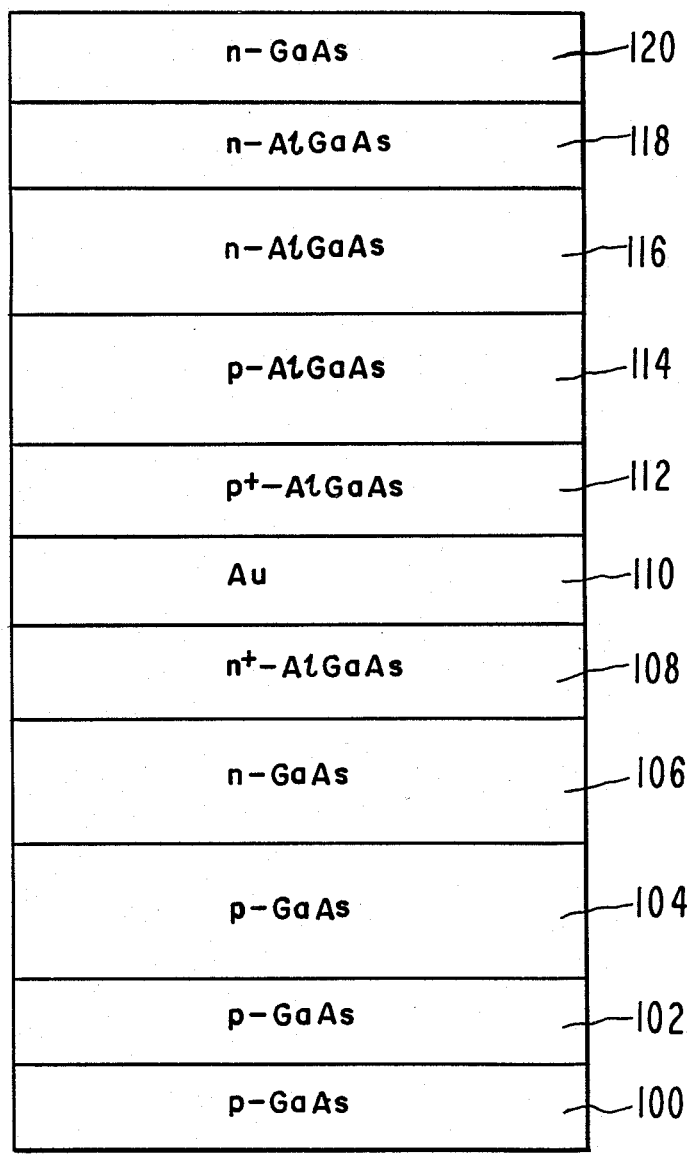
FIG. 4 is a schematic section of a monolithic solar cell showing the gold-based junction of the invention.

It is important, therefore, to have a relatively high bandgap material used for the upper subcell and adjacent to the shorting metal (Au). An example of such a high bandgap semiconductor is AlGaAs. AlGaAs solar cells have been grown with bandgaps as high as 1.93 eV. A particular case of an AlGaAs upper subcell and a GaAs lower cell is shown in FIG. 4. A substrate 100 of p-GaAs material has a buffer layer 102 of p-GaAs grown on it. Over this is grown a lower subcell base 104 of p-GaAs, and then lower subcell emitter 106 of n-GaAs. The junction comprises a heavily-n type layer (n+) of AlGaAs 108, a gold layer 110, a heavily-p type (p+) layer of AlGaAs 112. Over the junction an upper subcell is formed of the upper subcell base 114 of p-AlGaAs and an upper subcell emitter 116 of n-AlGaAs. A window 118 of n-AlGaAs is formed over the upper subcell and over the window is formed a contact layer 120 of n-GaAs. A GaAs lower subcell is included because it is lattice matched to AlGaAs and therefore convenient to grow. However, any material of bandgap lower than that of the AlGaAs could be substituted, and it would not have to be lattice matched to the AlGaAs. If it were not lattice matched, an appropriate graded layer would have to be inserted, as is usual in this art. [Abrahams et al, "Dislocation Morphology in Grade Heterojunctions", *J. Materials Science*, 4, p. 223 (1969); Dietze et al, "$Ga_{0.80}In_{0.20}As$ 1.20-eV High Quantum Efficiency Junction for Multijunction Solar Cells", *Appl. Phys. Lett.*, 41, p. 984 (1982); Lewis et al, "The Crystallographic Connection of MOCVD-Grown Monolithic Cascade Subcells Via Tranparent Graded Layers", *J. Crystal Growth*, 69, p. 515 (1984)). Other examples of high bandgap materials for which the junction would be suitable would be GaAsP, GaInP, AlGaInP, and AlGaInAs.

Figure 5:
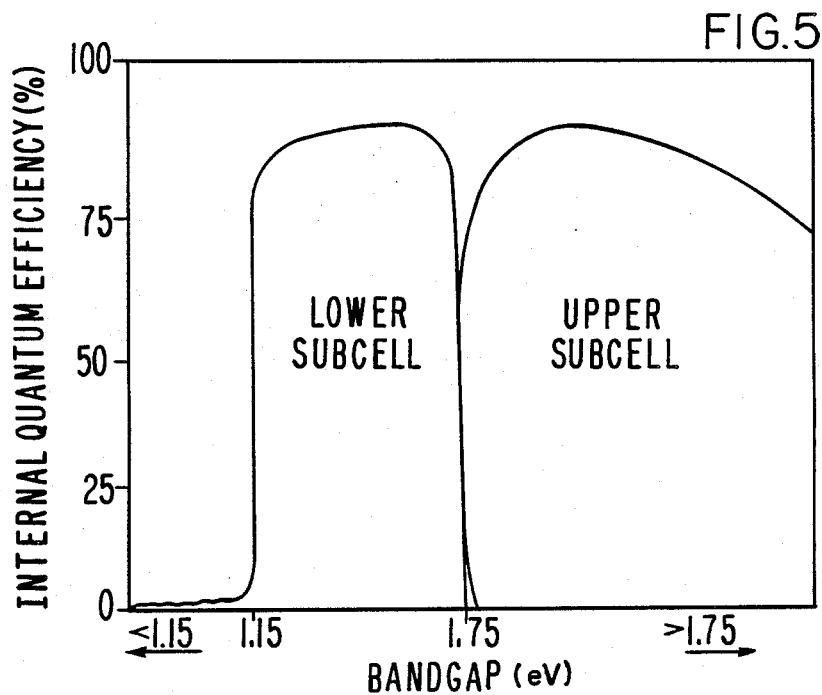
FIG. 5 is a schematic graph of internal quantum efficiency for a two-layer cell.
Figure 6:
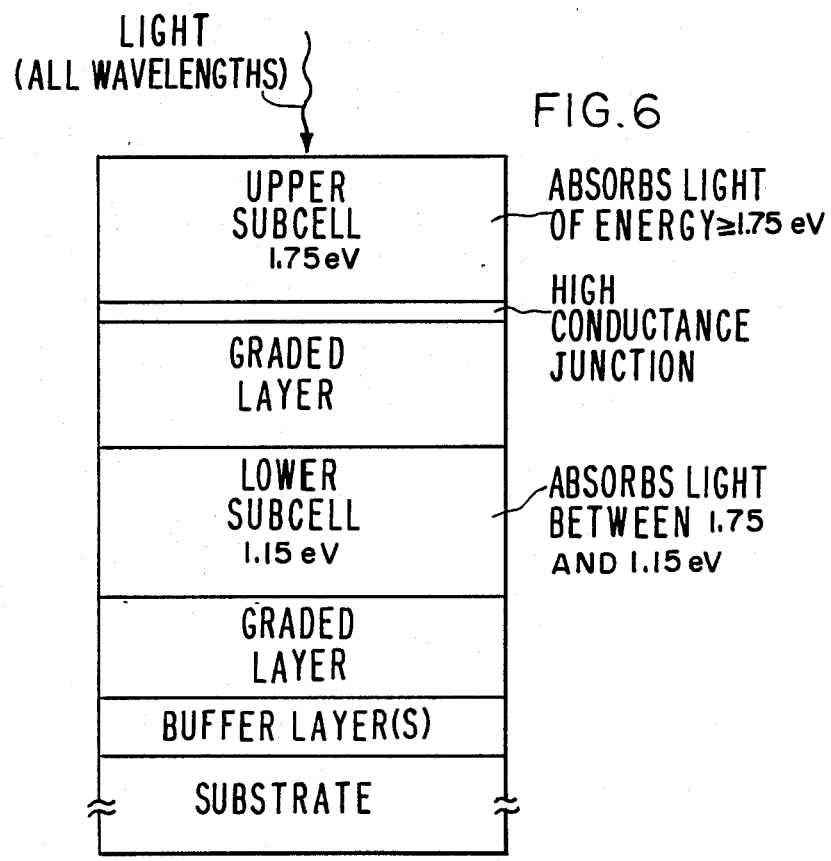
FIG. 6 is a schematic section of a two-layer cell of bandgap 1.75 and 1.15 eV

In a cascade solar cell, the upper subcell absorbs photons of energy equal to or exceeding its own bandgap, and transmits the remainder. The lower subcell, in turn, absorbs photons of energy $\geq 0$ its own bandgap. As an example, FIG. 5 shows typical quantum efficiencies of the two subcells of a multijunction cascade. The quantum efficiency is a measure of how well the subcell converts light to electricity; 100% is the maximum possible value. In this case, the bandgap of the upper subcell is 1.75 eV (for AlGaAs) and that of the lower subcell is 1.15 eV (for InGaAs). The upper subcell absorbs light of bandgap $\geq 1.75$ eV. Now, only light of bandgap $\leq 1.75$ eV is left over for the lower subcell. The lower subcell then absorbs the light of bandgap between 1.15 eV and 1.75 eV. Light of bandgap below 1.15 eV is not used in this structure, and passes through. FIG. 6 shows a schematic cross section of this structure and where the light is absorbed. The graded layers are inserted in their normal positions. They are necessary because this particular lower subcell is GaInAs (lattice mismatched with respect to the GaAs substrate) and the upper subcell is AlGaAs (lattice mismatched with respect to the lower subcell).

If the lower subcell is to function well, it must receive as much as possible of the light of bandgap below 1.75 eV. Hence it is important that the high conductance junction not absorb such light. If the bandgap of the high conductance junction $\geq$ the bandgap of the upper subcell (in this case 1.75 eV), it will not absorb any light which would have been destined for the lower subcell. The upper subcell has already absorbed its share of the light of energy exceeding 1.75 eV, so it does not matter if the high conductance junction absorbs any leftover light of energy exceeding 1.75 eV. However, if the bandgap of the high conductance junction is less than 1.75 eV, it will steal some of the light from the lower subcell and reduce the efficiency of the lower subcell. The only way this situation is acceptable is if the high conductance junction is very thin, so that only a small amount of light is absorbed or reflected.

A buffer layer of GaAs is traditionally grown as the first epitaxial layer upon a GaAs substrate. If possible, the doping level is matched closely to that of the substrate. The quality of lattice-matched epitaxial layers grown by MOCVD is higher than that of the underlying substrate. Hence, the buffer layer provides a foundation of high crystalline quality upon which the rest of the structure can be grown. It is not unique to the high conductance junction structure nor to solar cells. However, it could be distinguished from the substrate by its electrical characteristics (such as doping level) and by its higher crystalline quality.

In a III-V solar cell structure, the doping level in the base is often lower than that of the underlying substrate and buffer layer. The low base doping levels (about $5 \times 10^{17}/cm^3$) is required for long minority carrier diffusion lengths, which yields efficient current collection. However, the underlying buffer layer and substrate are often doped more heavily, which reduces their resistance. This is advantageous because the back contact of the solar cell is located on the back of the substrate. If all layers (i.e., buffer layer and substrate) between the cell base and the back contact have low resistance, very little current will be lost en route, and the cell efficiency will increase. Hence, if the doping levels and growth conditions of the buffer layer and cell base were the same, it would not be possible to distinguish one from the other and they would basically be the same layer.

Distinctions between "lightly doped" ($p^-$, $n^-$), "moderately doped" (p, n) and "heavily doped" ($p^+$, $n^+$) depend to a great extent on the device application. For example, what is considered lightly doped for a solar cell may be heavily doped for an FET. In III-V solar cells, typical base doping levels are between about $2 \times 10^{17}/cm^3$ and $8 \times 10^{17}/cm^3$. Typical emitter doping levels are between about $8 \times 10^{17}/cm^3$ and $2 \times 10^{18}/cm^3$. All of these can be considered moderate levels for a solar cell. Doping levels exceeding about $2 \times 10^{18}/cm^3$ can be considered heavily doped, in a solar cell structure. The doping levels in the $p^+$ and $n^+$ regions adjacent to the shorting metal of the high conductance junction are in the mid- to high- $10^{18}$ range.

Suitable dopants for the materials mentioned heretofore are zinc, cadmium, magnesium, beryllium, and manganese, for p-dopants, and silicon, germanium, tin, sulfur, selenium and tellurium for n-dopants. Note that column IV elements, such as silicon and germanium, are amphoteric. They yield n-doping where they are on a V lattice site [which is where they most commonly go in MOCVD] but p-doping when on a III lattice site. These dopants can be generated in the organometallic reactor from dimethylzinc [DMZn] or diethylzinc [DEZn] for zinc; dimethylcadmium [DMCd] for cadmium; bis(cyclopentadienyl)magnesium [Cp$_2$Mg] for magnesium; diethylberyllium [DEBe] for beryllium; cyclopentadienyl manganese tricarbonyl for manganese; silane or disilane for silicon; germane for germanium; tetramethyltin (TMSn) for tin; hydrogen sulfide for sulfur; hydrogen selenide or dimethylselenium (DMSe) for selenium; dimethyltellurium (DMTe) or diethyltelluriuym (DETe] for tellurium.

Doping levels are controlled not only by the flow of dopant source, but by the general deposition conditions of the material. They also depend on the semiconductor; for example, a given dopant may incorporate more efficiently in, say, GaAs than in AlGaAs, or vice versa. They are also reactor dependent; a set of growth conditions which gives a given doping level in one reactor will likely give a result in another reactor. They are empirically determined for a given reactor. I usually use experimental calibration or "doping curves", which are plots of doping level versus dopant flow for a given set of growth conditions on a particular reactor.

A sample set of conditions for depositions of the high conductance junction in the cascade solar cell of FIG. 4 would be:

1. Grow the GaAs (lower) cell under conventional MOCVD conditions.

2. Grow the heavily-n type ($n^+$) AlGaAs of the high conductance junction under conventional MOCVD conditions. Unless this layer is very thin (less than about 125 Å), its bandgap should equal or exceed the bandgap of the upper subcell.

3. Stop the AlGaAs growth by stopping the flows of the gallium and aluminum alkyls. The flow of the ntype dopant precursor may also be stopped. Permit the reactor tube to flush out, maintaining the flow of arsine (122 to 244 cm$^3$/min) and of hydrogen carrier gas (8 to 12 liters/min) over the wafer, for about 15 seconds.

4. Reduce the temperature of the wafer to 250° C. while maintaining the flows of arsine and hydrogen. This will take about 5 minutes.

5. Shut off the arsine flow. Shut off the n-dopant flow if it was not stopped in step 3. Wait about 10 seconds, maintaining only the hydrogen carrier gas flow.

6. Start gold deposition by turning on the gold organometallic source. The source is held at 25° C. For example: for a layer of 10 Å average thickness, a carrier gas flow of 120 cm$^3$/min through a DMG (hfac) source will yield an average deposition rate of about 29 Å/min; so a deposition time of 21 sec is necessary. Although the other organometallic sources, DMG (acac) or DMG (tfac) could be substituted, DMG (hfac) is preferable because of its higher vapor pressure. Under these conditions, the mass flux of the DMG (hfac), 5 μmoles/min, is about 1/10 that of the trimethylgallium mass flux used in the growth of the GaAs subcell.

7. Shut off the gold source while maintaining a hydrogen carrier gas flow over the wafer, for about 10 seconds.

8. Resume the arsine flow and raise the wafer temperature to that desired for the growth of AlGaAs. For solar cells this will be about 780° C., and the process will take about 5 minutes.

9. Start the flows of gallium and aluminum alkyls, and the p-dopant precursor to grow the heavily-p type (p+) AlGaAs of the high conductance junction. (A precursor, in MOCVD, is a volatile chemical which is transported to the hot zone of the reactor, where it decomposes to deposit an element. Precursors are also called transport chemicals or transport agents.) Unless this layer is very thin (less than about 150 Å), its bandgap should equal or exceed the bandgap of the upper subcell.

10. Grow the AlGaAs (upper) cell under conventional MOCVD conditions.

These particular growth conditions for the growth of the gold layer are not exclusive ones. Some more detail on the choice of conditions and of approximate acceptable ranges follows.

In step 2 of the sample conditions for deposition of the high conductance junction, the n+layer thickness must be ≦125 Å only if its bandgap is less than that of the overlying upper subcell. This would ensure that the n+layer only absorb a limited portion (≦ about 1.5%) of the light which would otherwise pass through to the lower subcell. However, if the bandgap of the n+layer equals or exceeds that of the upper subcell, this is not a problem, and the n+layer can be of any thickness. Generally it is easier to work under the latter conditions, because growth of the structure is than much more controllable.

Exactly the same situation applies to the p+layer thickness ≦150 Å mentioned in step 9.

The values of 125 Å for the n+layer and of 150 Å for the p+layer are selected so that only about 3% of the incident light would be absorbed by this set of layers. This is considered an acceptable light loss for the underlying lower subcell. These are approximate numbers which I have used in my laboratory as guidelines.

Figure 7:
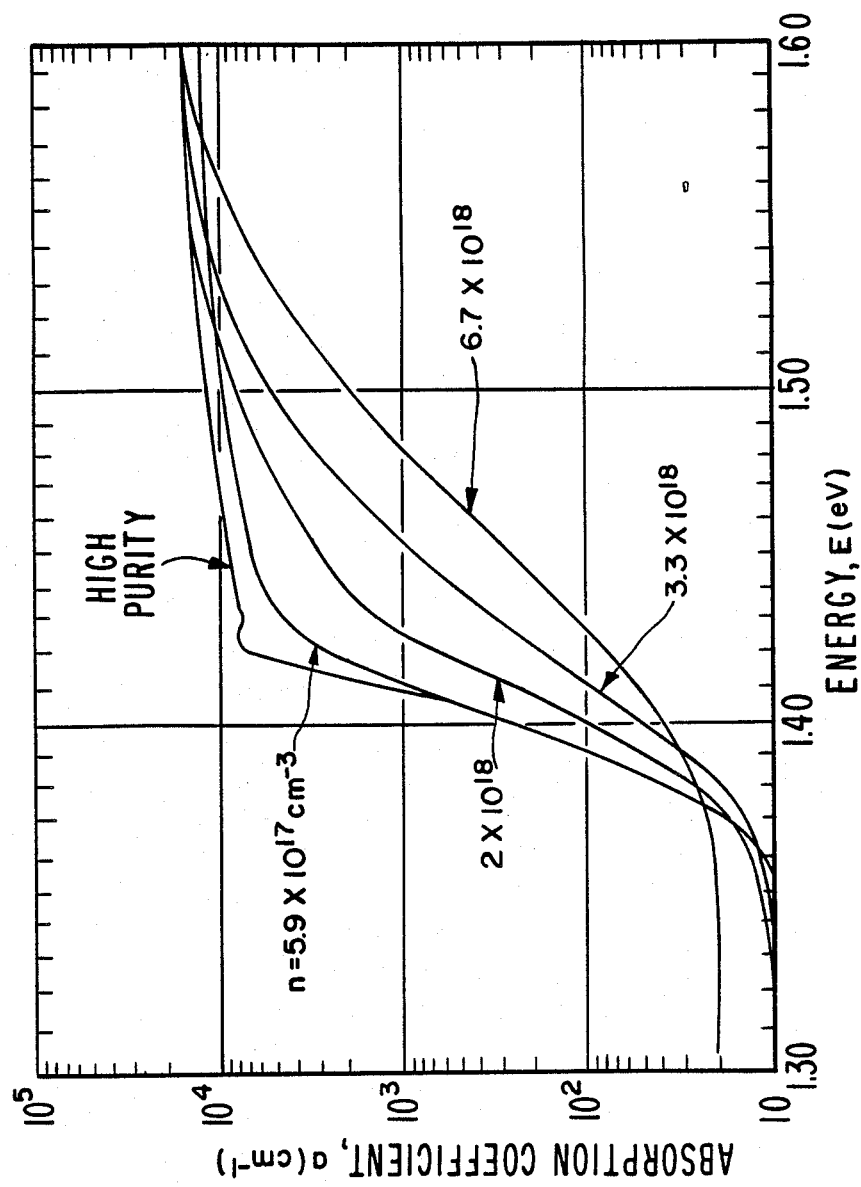
FIG. 7 is a graph of absorption coefficient with energy for heavily doped n-type GaAs at 297° K. for various doping levels.
Figure 8:
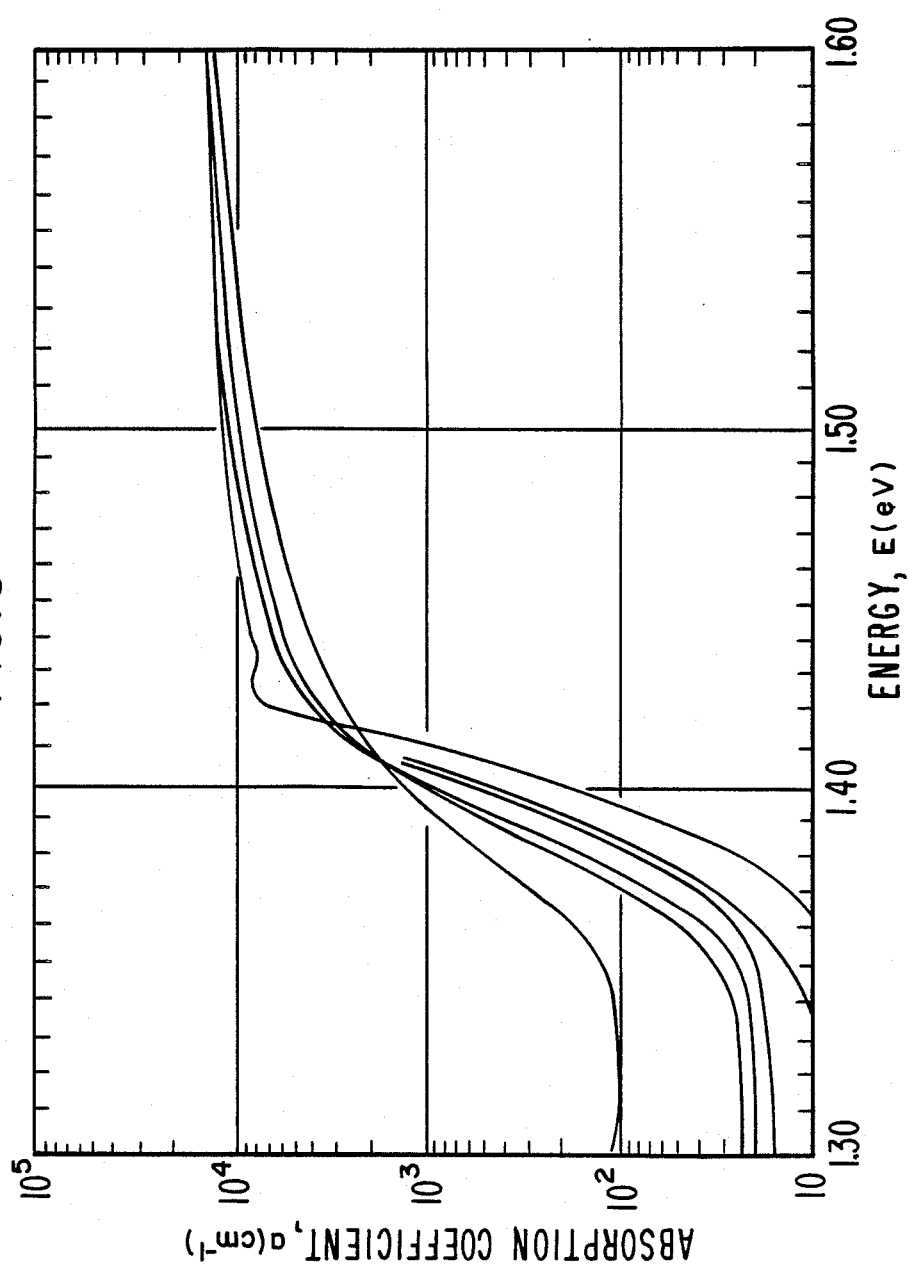
FIG. 8 is a graph of absorption coefficient with energy for heavily doped p-type GaAs at 297° K. for various doping levels.

The exact magnitude of the loss depends upon the absorption coefficient of the n+and p+materials. In turn, the absorption coefficients are functions of the nature of the semiconductor, the doping levels, and the wavelength of the incident light. Data for GaAs absorption coefficients are shown in FIGS. 7 and 8 for n− and p-type, respectively. (Casey et al, J. Appl. Phys., 46, 250 (1975)).

As a sample (order-of-magnitude) case, consider doping levels of $3.3 \times 10^{18}$/cm$^3$ for n+GaAs and $2.4 \times 10^{18}$/cm$^3$ for p+GaAs. Assume that the acceptable absorption (A) in each layer is 1.5%. The absorption coefficients ($\alpha$) are taken from FIGS. 7 and 8. It is convenient to look at 1.50 eV, which is reasonably above the GaAs bandedge. At 1.50 eV, $\alpha$ for the n-type GaAs is $6 \times 10^3$/cm, and for the p-type GaAs is $9 \times 10^3$/cm. The layer thickness $L = A/\alpha$. Hence at 1.50 eV, the acceptable layer thicknesses for absorptions of 1.5% would be 250 Å for the n-type and 167 Å for the p-type.

There will be some diffusion of dopant from the heavily doped layer to the lightly doped layer, but under normal MOCVD deposition conditions, it is not a problem for this structure. One of the major advantages of the high conductance junction of the invention is that the junction is shorted by metal at the p-n interface; the junction will short even if the doping levels are substantially lower and more graded than those required for a classical tunnel junction. In fact, this is exactly why classical tunnel junctions have so much difficulty in multijunction solar cells; the conductance of a classical tunnel junction is extremely sensitive to even small amounts of dopant diffusion, and hence they typically become much more resistive when overlying layers are deposited. A classical tunnel junction, however, contains no shorting metal; it depends exclusively on very high doping levels and an extremely abrupt doping profile.

As for any MOCVD process, the growth conditions depend upon the characteristics of the organometallic source. The three sources are all volatile under ambient conditions. DMG (acac) and DMG (tfac) are solids at room temperature, and DMG (hfac) is a liquid. The source is contained in a conventional MOCVD bubbler with a dip tube entrance. Transport would be by conventional means, in a stream of carrier gas such as hydrogen. The carrier gas enters the bubbler, flows through the chemical and emerges saturated with the chemical. This stream eventually enters the reactor tube where it is thermally decomposed to yield gold metal on the substrate wafer.

Reasonable flows of source chemical can be determined from the vapor pressure at a given source temperature. (Room temperature vapor pressures are given in American Cyanamid data sheet ECT-006: Physical Data Sheet for DMG (acac), DMG (tfac) and DMG (hfac).) The flow of the gold source should be relatively low, approximately 1/10 to 1/100 of the trimethylgallium flow used to deposit GaAs. Normal trimethylgallium flows in my reactors at about 50 μmoles/min. This permits reasonable control over the thickness of the thin gold layer. If the gold sources are held at 23° to 25° C., corresponding carrier gas flows through the sources would be as follows: for 1/10 of the trimethylallium flow (i.e., 5 μmoles/min), 1,000 cm$^3$/min for DMG (acac), 213 cm$^3$/min for DMG (tfac), and 12 cm$^3$/min for DMG (hfac); for 1/100 of the trimethylgallium flow, 10,000 cm$^3$/min for DMG (acac), 2130 cm$^3$/min for DMG (tfac), and 120 cm$^3$/min for DMG (hfac). It should be noted that gold source flows exceeding about 2000 cm$^3$/min are not too desirable, because they will significantly affect the total gas flow through the reactor.

The deposition time will depend upon the desired thickness of the gold layer. In my atmosphericpressure, horizontal MOCVD reactors, the utilization efficiency of sources is about 10%, if the deposited material is not volatile. This applies to molecules such as those of gold, which are not volatile at conventional MOCVD deposition temperatures; once they are generated by thermal decomposition of the source, they stick to the surface of the wafer. If the utilization efficiency of the gold sources is about 10%, then the expected growth rates of gold film would be: for an initial source flow 1/10 that of trimethylgallium, 28.6 Å/min; for an initial source flow 1/100 that of trimethylgallium, 2.86 Å/min. It would be necessary for the gold film to be very thin so that it would neither absorb nor reflect significant incident light. For an average film thickness of 10 Å, the required deposition time would depend upon the growth rate. At a growth rate of 28.6 Å/min, 21 sec would be necessary; at a growth rate of 2.86 Å/min, 3.5 min would be necessary.

The crystal structure of gold differs from that of most of the semiconductors of interest. If the gold were present as a relatively thick continuous layer, it would be difficult to subsequently nucleate single-crystal semiconductor on top of it. There is a major difference between the case of Au, and the case of In or Ga. Indium and gallium are molten at typical MOCVD deposition temperatures (600° to 800° C.). Because of surface tension, they tend to bead up into droplets when small amounts are deposited. However, gold is a solid under these conditions. It is therefore necessary to manipulate the deposition conditions to favor the growth of isolated gold patches, with exposed areas of underlying semiconductor. In addition, the gold should be prevented from moving around on the surface (and redistributing itself into a continuous film) once the initial patches are deposited. Such conditions include growth of very thin layers, relatively rapidly and at low temperatures. Low growth temperatures reduce the mobilities of atoms on the surface.

The minimum deposition temperature for deposition of the gold layer is that required to thermally decompose the gold organometallic source. All three of the gold sources begin to thermally decompose at about 160° C. to 180° C. (See: Baum et al, Appl. Phys. Lett., 47, 538 (1985); Baum et al, J. Vac. Sci. Technol., B4, 1187 (1986); Baum et al, J. Electrochem. Soc., 134, 2616 (1987).) To ensure relatively complete decomposition in the short period of time that the source is over the hot substrate, a practical minimum deposition temperature might be about 250° C.

It is necessary to stop growth when switching from a semiconductor layer to the gold layer and back to a semiconductor layer. Not only does this permit efficient flushing of the reactor tube and make the interfaces between the layers sharper, but it allows sufficient time for changing temperatures. The deposition temperature of the gold will likely be less than the typical 650° to 780° C. used to deposit AlGaAs, for example.

As described above, the gold layer will not necessarily deposit automatically as a discontinuous layer unless the growth conditions are appropriate. The layer must be very thin, the deposition temperature low and the growth rate relatively high. I would estimate that the average layer thickness should be about 10 Å for the growth to remain discontinuous, although thicker layers may be possible (up to perhaps 50Å) under appropriate growth conditions.

The layer should be discontinuous if high quality semiconductor is to be grown on top of it. Gold crystallizes in a face-centered-cubic lattice, with lattice constant of 4.078Å. (See: Gray, Am. Inst. Physics Handbook, McGraw-Hill, New York (1972), p. 9–5.) Although the zincblende lattice of GaAs and related compounds is also face-centered-cubic, the lattice constants are much larger; for example, that of GaAs is 5.65Å, which is mismatched by 28% with respect to that of gold. It is difficult to grow excellent overlying epitaxial material if the mismatch between the two layers exceeds 2 or 3%. Mismatch up to about 7% can be accommodated if the layers are very thin (several tens of angstroms); this is called psuedomorphic growth. However, 28% is a very difficult case; the overlying layers would be severely damaged crystallographically.

It is preferable that the gold layer not be continuous, and that the deposition conditions be appropriately chosen to create this condition. The methods known in the cited prior art differ in several ways from the method of the invention and do not suffice to create these conditions. The depositions, although using an organometallic source to deposit the gold, were not done in an MOCVD reactor. They were done in an isolated stainless-steel high-vacuum cell. The cell contained the gold source, so there was a constant vapor pressure of source over the substrate. This differs from MOCVD, in which a carrier gas transports sources from their reservoirs into a separate hot reaction chamber. No overlying material was grown above the deposited gold. In fact, no other epitaxial materials were deposited at all, so the compatibility of the gold deposition with that of other epitaxial materials did not have to be taken into account. The gold source was decomposed with laser irradiation; in fact, the substrate was kept at room temperature. The gold also had to be annealed after growth. In the high conductance junction, the gold layer is annealed during MOCVD growth process.

Gold metal has been previously used for conventional ohmic and Schottky contacts to semiconductors, but is has been deposited by other methods, most commonly evaporation or sputtering. There are a few reports of elemental gold deposition by pyrolysis of solid polymer films containing gold. (See: Fisanick, et al, J. Appl. Phys., 57, 1139 (1985); Gross et al, J. Appl. Phys., 60, 529 (1986); Gross et al, Appl. Phys. Lett., 47, 923 (1985).) However, the polymer film is involatile and cannot be transported by MOCVD. It must be coated on the surface before the substrate is loaded into the chamber where the film will be decomposed. Hence it cannot be deposited in situ during an MOCVD growth run (and does not include an MOCVD transport chemical); the decomposition was also carried out with a laser on an unheated quartz substrate.

This invention is not limited to the preferred embodiment and alternatives heretofore described, to which variations and improvements may be made, without leaving the scope of protection of the present patent, the characteristics of which are summarized in the following claims.

What is claimed is:

1. A method of forming a monolithic cascade solar cell including sub-cells of different radiation converting bandgaps comprising the steps of:
   forming a first radiation converting solar sub-cell having a first bandgap on a substrate;
   forming an interconnecting thin layer of gold over said first sub-cell, said thin layer of gold being substantially transparent to wavelengths of radiation having frequency matching the bandgap of said first radiation converting sub-cell; and forming at least one more radiation converting solar sub-cell having a second bandgap over said interconnecting thin layer of gold.

2. A method of forming a monolithic cascade solar cell as in claim 1 wherein all forming steps are sequentially performed without exposure to atmosphere of any intermediate product.

3. A method of forming a monolithic cascade solar cell as in claim 2 wherein all forming steps are performed by organometallic vapor phase epitaxy.

4. A method of forming a monolithic cascade solar cell as in claim 3 where the steps of forming an interconnecting layer of gold is the step of forming an interconnecting layer of gold by organometallic vapor phase epitaxy from the group including methyl gold acetylacetonate, methyl gold trifluoroacetylacetonate, and methyl gold hexafluoroacetylacetonate.

5. A method of constructing a monolithic cascade solar cell as in claim 4 where the steps of forming an interconnecting layer of gold is the step of forming an interconnecting layer of gold by organometallic vapor phase epitaxy from methyl gold acetylacetonate.

6. A method of constructing a monolithic cascade solar cell as in claim 4 where the step of forming an interconnecting layer of gold is the step of forming an interconnecting layer of gold by organometallic vapor phase epitaxy from methyl gold trifluoroacetylacetonate.

7. A method of constructing a monolithic cascade solar cell as in claim 4 where the step of forming an interconnecting layer of gold is the step of forming an interconnecting layer of gold by organometallic vapor phase epitaxy from methyl gold hexafluoroacetylacetonate.

8. A method of constructing a monolithic cascade solar cell as in claim 4 where the step of forming an interconnecting layer of gold is the step of forming an interconnecting layer of a substantial plurality of unconnected bead-like bodies of gold.

9. A method of constructing a monolithic cascade solar cell as in claim 8 wherein the step of forming an interconnecting layer of gold is the step of forming an interconnecting layer of a substantial plurality of unconnected beads of gold, each bead being less than approximately 100 Angstroms in any direction, said layer being no less than 10 Angstroms and no more than 50 Angstroms thick.

10. The method of claim 9 further comprising the steps of depositing layers of high bandgap material of bandgap greater than approximately 1.7 eV on both sides of said gold layer, said layers of high bandgap material being lattice matched by graded layers to adjacent semiconductor layers and through said thin layer of gold by graded layers to each other, said layers of high bandgap material being heavily doped.

11. The method of claim 1 including the steps of forming a layer of graded lattice constant between said first radiation converting solar sub-cell and said substrate and forming a layer of graded lattice constant between said second radiation converting solar sub-cell and said first radiation converting solar sub-cell.

12. The method of claim 1 wherein said first radiation converting sub-cell and said second radiation converting sub-cell have different lattice constants, and including the steps of forming graded layers between a lower layer and the layer formed above each graded layer, said graded layers being a means for lattice matching layers of different lattice constant.

13. The method of claim 3 wherein said first radiation converting sub-cell and said second radiation converting sub-cell have different lattice constants, and including the steps of forming graded layers between a lower layer and the layer formed above each graded layer, said graded layers being a means for lattice matching layers of different lattice constant.

14. The method of forming a monolithic cascade solar cell including sub-cells of different radiation converting bandgap, comprising the steps of:

forming a buffer layer on a substrate;

forming a layer of graded lattice constant on said buffer layer;

forming a first radiation converting solar sub-cell on said grading layer, said first radiation converting solar sub-cell having a lower layer of a first doping type and an upper layer of a second doping type said first radiation converting solar sub-cell having a first bandgap;

forming a first connecting layer of high bandgap material of bandgap greater than approximately 1.7 eV, doping type of said first connecting layer being of the same doping type as said second doping type of said upper layer of said first radiation converting solar sub-cell. Said doping of said first connecting layer being more heavy than the doping of said first radiation converting solar sub-cell;

forming an interconnecting thin laye of gold over said first sub-cell, said thin layer of gold being substantially transparent to a wavelength of radiation having frequency matched to the bandgap of said first radiation converting solar sub-cell;

forming a second connecting layer of high bandgap material of bandgap greater than approximately 1.6 eV, the doping of said second connecting layer being of the same doping type as said lower layer of said first radiation converting solar sub-cell said doping of said second connecting layer being more heavy than in said first radiation converting solar sub-cell;

forming a second radiation converting solar sub-cell on said second connecting layer, said second radiation converting solar sub-cell having a lower layer of a first doping type and an upper sub-cell of a second doping type, said second radiation converting solar sub-cell having a second bandgap greater than said first bandgap of said first radiation converting solar sub-cell;

all forming steps being sequentially performed without exposure to atmosphere of any intermediate product;

all forming steps being performed by organometallic vapor phase epitaxy.

15. A monolithic cascade solar cell including sub-devices of different radiation converting bandgaps, comprising:

a substrate;

a lower sub-device having a first radiation converting bandgap formed on said substrate;

an upper sub-device having a second radiation converting bandgap formed on said lower substrate; and a thin layer of gold interconnecting said sub-devices, said layer being substantially transparent to wavelengths of radiation matching said first bandgap.

16. A monolithic semiconductor device as in claim 13 wherein said lower sub-device is lattice-matched to said substrate, said upper sub-device is lattice-matched to said lower sub-device, and said thin layer of gold is sufficiently discontinuous to permit lattice-matching of said upper sub-device to said lower sub-device.

17. A monolithic semiconductor device as in claim 14 wherein said thin layer of gold material is of average thickness no less than 10 Angstroms and no more than 50 Angstroms.

18. An improved monolithic semiconductor cascade device as in claim 15 wherein said thin layer of gold comprises a substantial plurality of unconnected beads of material.

19. The device of claim 16 further comprising layers of high bandgap material of bandgap greater than approximately 1.7 eV on both sides of said gold layer, said layers of high bandgap material being lattice matched to adjacent semiconductor layers and through said thin layer of gold to each other, said layers of high bandgap material being heavily doped.

20. The device of claim 1 including a first grading layer formed between said lower sub-device and said substrate and a second grading formed between said upper sub-device and said lower sub-device.

* * * * *